(12) United States Patent
Barge et al.

(10) Patent No.: US 8,951,885 B2
(45) Date of Patent: Feb. 10, 2015

(54) INSULATION WALL BETWEEN TRANSISTORS ON SOI

(75) Inventors: David Barge, Grenoble (FR); Pierre Morin, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 116 days.

(21) Appl. No.: 13/571,603

(22) Filed: Aug. 10, 2012

(65) Prior Publication Data

US 2013/0049163 A1 Feb. 28, 2013

(30) Foreign Application Priority Data

Aug. 29, 2011 (FR) ...................................... 11 57596

(51) Int. Cl.
*H01L 21/76* (2006.01)
*H01L 21/762* (2006.01)

(52) U.S. Cl.
CPC .............................. *H01L 21/76283* (2013.01)
USPC ................................... 438/427; 257/E21.548

(58) Field of Classification Search
USPC .......................................... 438/425, 426, 427
See application file for complete search history.

(56) References Cited

U.S. PATENT DOCUMENTS

| | | | | |
|---|---|---|---|---|
| 5,910,018 | A * | 6/1999 | Jang ............................... | 438/425 |
| 6,696,348 | B1 * | 2/2004 | Xiang ........................... | 438/427 |
| 2001/0042890 | A1 | 11/2001 | Liang | |
| 2004/0110383 | A1 | 6/2004 | Tanaka | |
| 2008/0150074 | A1 | 6/2008 | Mishra | |

\* cited by examiner

*Primary Examiner* — Chandra Chaudhari
(74) *Attorney, Agent, or Firm* — Allen, Dyer, Doppelt, Milbrath & Gilchrist, P.A.

(57) ABSTRACT

An insulation wall separating transistors formed in a thin semiconductor layer resting on an insulating layer laid on a semiconductor substrate, this wall being formed of an insulating material and comprising a wall crossing the thin layer and the insulating layer and penetrating into the substrate, and lateral extensions extending in the substrate under the insulating layer.

9 Claims, 5 Drawing Sheets

INSULATION WALL BETWEEN TRANSISTORS ON SOI

CROSS REFERENCE TO RELATED APPLICATION

This application is a translation of and claims the priority benefit of French patent application number 11/57596, filed on Aug. 29, 2011, entitled "INSULATION WALL BETWEEN TRANSISTORS ON SOI", which is hereby incorporated by reference to the maximum extent allowable by law.

BACKGROUND OF THE INVENTION

1. Field of the Invention

The present invention relates to the lateral insulation between transistors formed on a substrate of semiconductor on insulator or SOI type.

2. Discussion of Known Art

An insulation structure between two transistors of complementary type is shown in FIGS. 1A to 1D. FIGS. 1A and 1C. are to views and FIGS. 1B and ID are cross-section views along planes BB and D-D defined in FIGS. 1A and 1C. The case of an SOI structure comprising a thin silicon layer 1 on a thin silicon oxide layer 2 on a silicon substrate 2 is here considered.

As illustrated in FIGS. 1A and 1B, in an integrated circuit, to define active areas. Where transistors are to be formed, trenches 4 are made to cross layers 1 and 2 and to penetrate into substrate 3. Trenches 4 further delimit wells 3a and 3b of opposite doping, shallower than trenches 4 and arranged under each of the active areas. Trenches 4 are filled with silicon oxide, commonly called field oxide 5, to form insulation walls.

As illustrated in FIGS. 1C and 1D, transistors 6 comprise, between drain and source regions 7, a conductive gate 10 insulated by a layer 8. Spacers 9 are formed on either side of the gate. Source and drain regions 7 axe formed after the gate, for example by transforming into silicide the apparent portions of this layer 1. Simultaneously, the upper portion of gate 10a is silicided.

Each of the operations resulting in the structure of FIG. 1D implies different cleanings. Cleanings are in particular involved:

on removal of the mask for defining field oxide 5,
before the forming of gate oxide layer 8,
after the forming of gate 10,
after the forming of spacers 9,
before and after the forming of silicided areas 7 and 10a.

Such cleanings use acids, and especially diluted hydrofluoric acid. These acids etch field oxide 5, more specifically in regions located at the periphery of the field oxide regions. This results in the forming of cavities 11 which extend at the periphery of field oxide 5 and which may reach substrate 3, especially in the case of structures for which the thicknesses of insulator layer 2 and of semiconductor layer 1 are small. Indeed, in some technologies, such thicknesses may be as low as from 10 to 25 nm. The local disappearing of this insulator on the sides during the forming of the circuits may be the cause of multiple transistor failure modes. For example, in the forming of silicide regions 7 and 10a, a short-circuit may appear between source and drain regions 7 and wells 3a and 3b formed in substrate 3.

To overcome this disadvantage, has been provided to for an insulation wall of the type illustrated in FIG. 2. This drawing shows trench 4 filled with an insulator 5. Further, an insulating layer 5a formed above insulator and protrudes on either side of the trench. Thus, in the various above-mentioned acid attacks, the risk for cavities going all the way to substrate 3 to be created is limited. However, this result is clearly obtained at the cost of a loss of space in the active silicon areas, which may adversely affect the transistor performance.

There thus is a need for insulation wails between transistors least overcoming some of the disadvantages of prior art walls.

SUMMARY OF THE INVENTION

To fulfill this need, an embodiment provides an insulation wall separating transistors formed in a thin semiconductor layer resting on an insulating layer laid on a semiconductor substrate, this wall being formed of an insulating material and comprising a wall crossing the thin layer and the insulating layer and penetrating into the substrate, and lateral extensions extending in the substrate under the insulating layer.

According to an embodiment, the thin layer is made of silicon, germanium, or silicon-germanium; the insulating layer is and the insulating material of the wall are made of silicon oxide; and the substrate is made of silicon.

According to an embodiment, the wall insulates doped wells formed in the substrate under each transistor, and the thin semiconductor layer has a thickness ranging from 5 to 15 nm, the insulating layer has a thickness ranging from 10 to 30 nm, the wells have a depth ranging between 0.5 and 1 µm, the wall has a width ranging from 50 to 100 nm, and the lateral extensions have a width ranging between 5 and 10 nm and a height ranging between 5 and 10 nm.

An embodiment provides a method for manufacturing an insulating wall separating transistors formed in a thin semiconductor layer resting on an insulating layer laid on a semiconductor substrate, comprising the steps of:

etching partial trenches according to the pattern of the insulating wall, across a first width, this etching stopping at the level of the substrate;

protecting the etch sides;

removing part of the silicon substrate at the bottom of the partial trenches down to a first depth and across a second width greater than the first width;

etching the trench down to a second depth greater than the first depth and across the first width; and filling with an insulator.

According to an embodiment, the protection of the sides is performed during said partial etching.

According to an embodiment, the side protection is performed after said partial etching and comprises the steps of: conformally depositing an insulator and removing the portion of this insulator which rests on the bottom of the opening.

According to an embodiment, the insulator is silicon nitride.

According to an embodiment, said removal of a portion of the silicon substrate is performed by isotropic etching.

According to an embodiment, said removal of a portion of the silicon substrate is performed by oxidizing the silicon.

The foregoing and other features and advantages will be discussed in detail in the following non-limiting description of specific embodiments in connection with the accompanying drawings.

BRIEF DESCRIPTION OF THE DRAWINGS

For clarity, the same elements have been designated with the same reference numerals in the different drawings and, further, as usual in the representation of integrated circuits, the various drawings are not to scale.

DETAILED DESCRIPTION

Figure 3A:
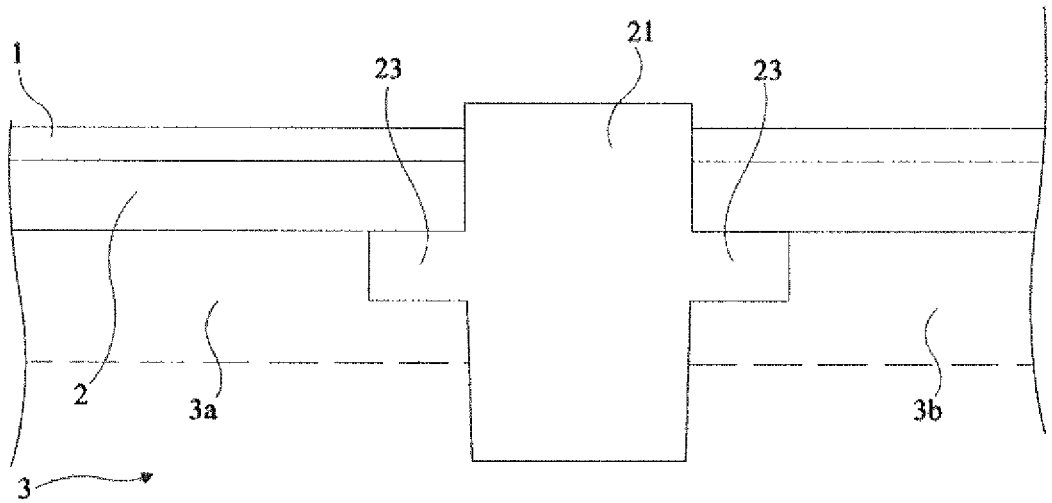
FIGS. 3A and 3B are cross-section views illustrating an insulation wall between active areas, respectively before and after the forming of transistors in the active areas.

FIG. 3A shows an insulation wall between active areas of an integrated circuit. This insulation wall is intended to delimit active areas in a thin semiconductor layer 1 formed on an insulator 2 resting on a substrate 3, generally a silicon substrate. Under the left-hand active area is formed a well of a first conductivity type 3a and under the right-hand active area is formed a well of a second conductivity type 3b. The insulation wall is formed of a vertical portion 21 crossing layers 1 and 2 and well 3a to reach substrate 3. This wall comprises lateral extensions 23 extending on either side of vertical portion 21 under a portion of insulating layer 2.

Figure 3B:
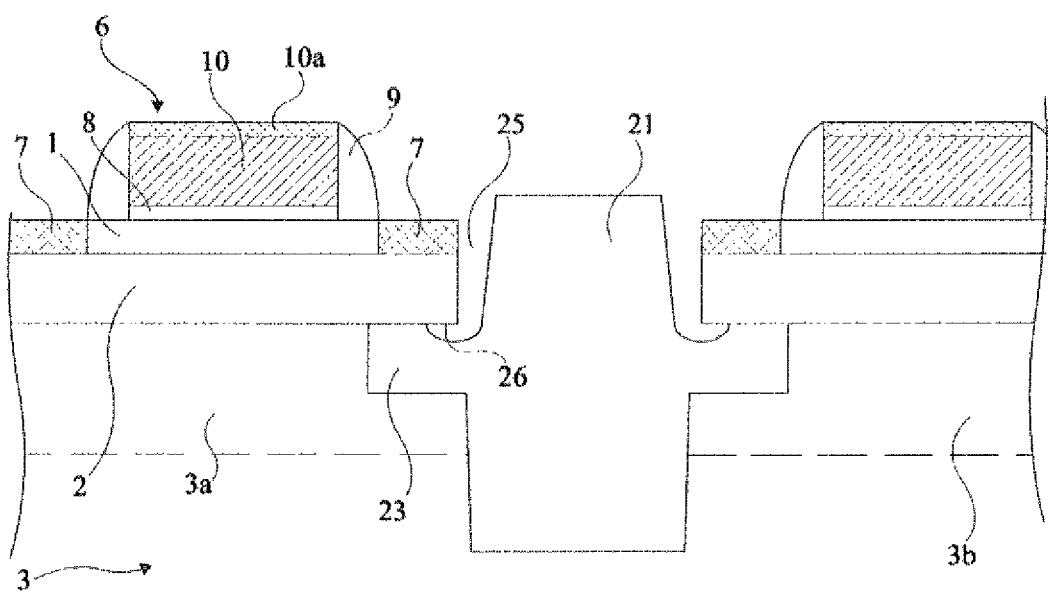

FIG. 3B illustrates the shape of the structure after the forming of components such as MOS transistors 6 in active areas located to the right and to the left of the drawing. The various elements of these MOS transistors are designated with the same reference numerals as in FIG. 1D. As described previously in relation with FIG. 1D, while the various cleanings necessary to form transistors 6 are carried out, cavities generally form at the outer limits of the wall at the level of its interfaces with adjacent layers. Such cavities comprise a first portion 25 along silicon layer 1 and along insulating layer 2. Then, the cavities risk having a lateral extension 26 under insulating layer 2. However, given the presence of lateral extensions 23 of the insulation wall, the risk for these cavities to join well 3a or 3b is extremely limited.

Another advantage of a wall of the type in FIG. 3A is that is does not limit the available surface area at the level of each of the active areas.

Another advantage of a wall of the type in FIG. 3A is as will be described hereafter, that it may be obtained by a particularly simple manufacturing method especially implying no additional masking step with respect to the forming of a simple wall such as that in FIGS. 1A and 1B.

Figure 1A:
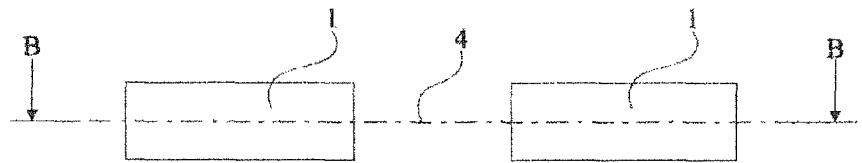
FIGS. 1A and 1C, previously described, are top views of two steps of the manufacturing of an insulation wall between active areas.
Figure 1B:
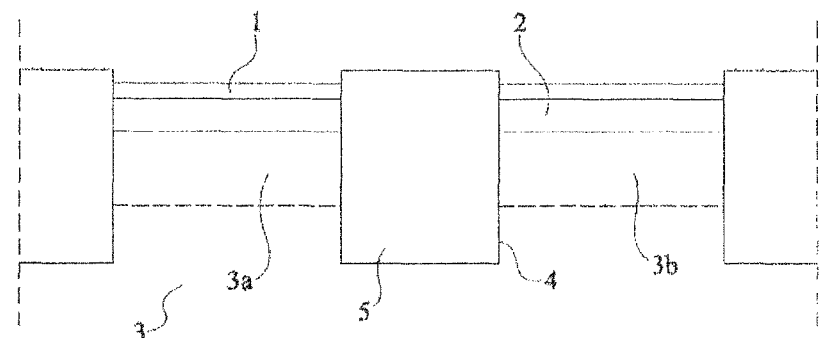
FIGS. 1B and 1D are cross-section views respectively corresponding to cross-section planes BB and DD of FIGS. 1A and 1C.
Figure 1C:
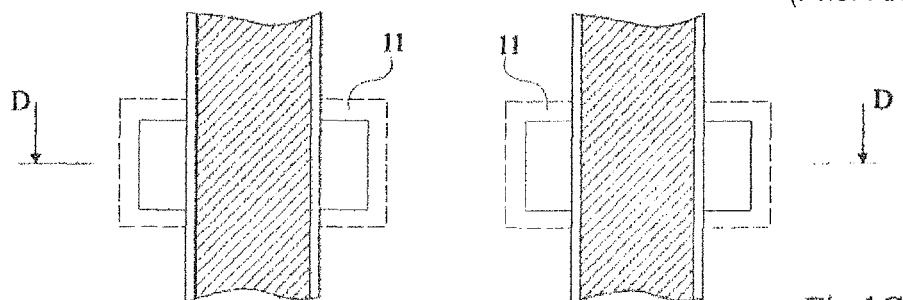
Figure 1D:
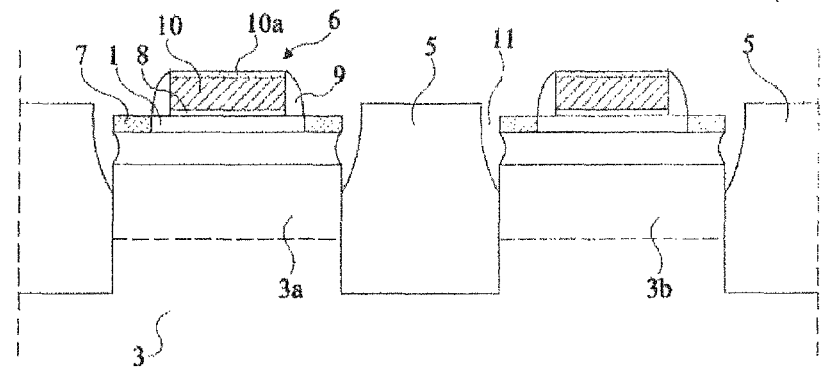
Figure 2:
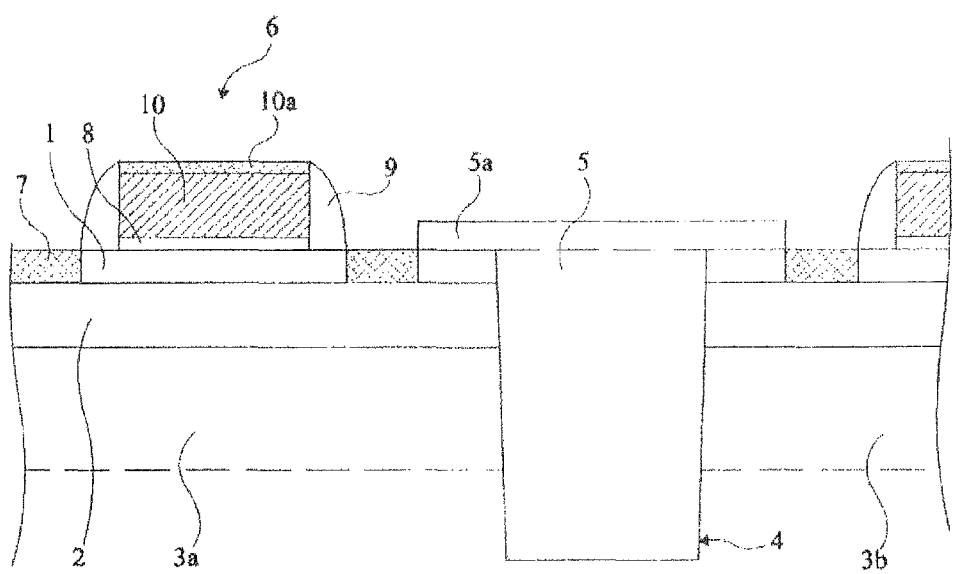
FIG. 2, previously described, illustrates an alternative insulation wall between active areas.

FIGS. 4A to 4E illustrate a first embodiment of a trench having a structure illustrated in FIG. 1A.

Figure 4A:
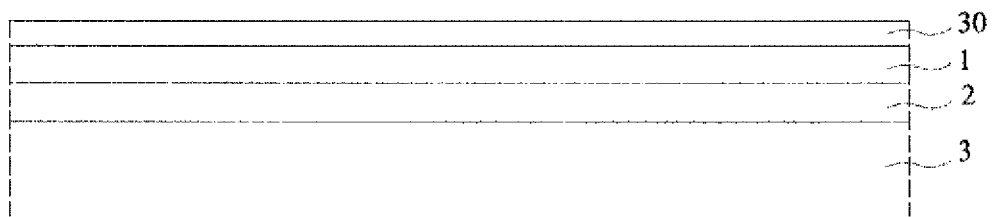
FIGS. 4A to 4E illustrate successive steps of the forming of a wall such as that in FIG. 3A according to a first embodiment.

As illustrated in FIG. 4A, it is started from an SOI-type structure comprising, on a semiconductor substrate 3, a thin insulating layer 2 and a thin semiconductor layer 1. The assembly is coated with a masking layer 30, for example, a silicon nitride layer.

Figure 4B:
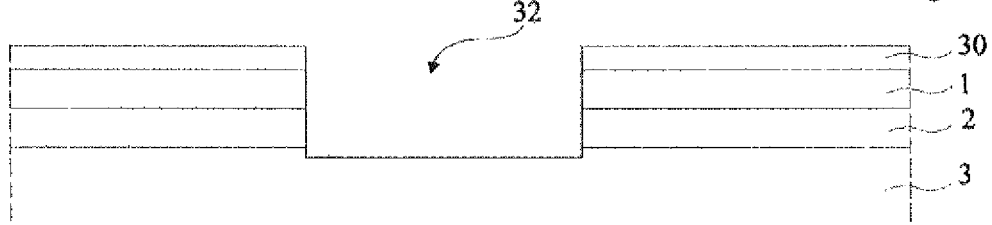

At the step illustrated in FIG. 4B, a trench 32 crossing successive layers 30, 1, 2 and reaching substrate 3 has been defined by masking and etched.

Figure 4C:
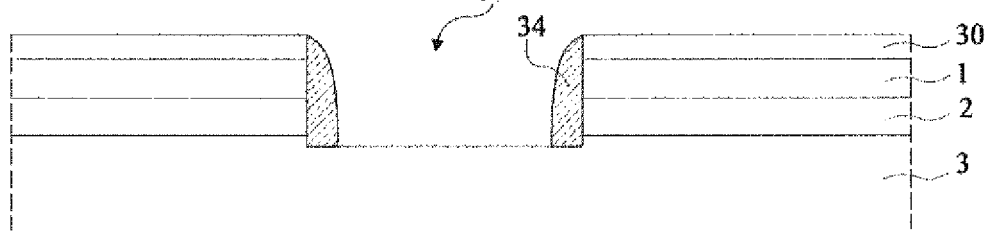

At the step illustrated in FIG. 4C, a protection layer 34 has been formed on the sides of trench 32. This protection layer may be formed by one of many known means. For example, a silicon nitride layer may be uniformly deposited, after which a anisotropic etching may be performed, which results in silicon nitride remaining on the side and in the removal of the silicon nitride from the bottom of the trench.

Figure 4D:
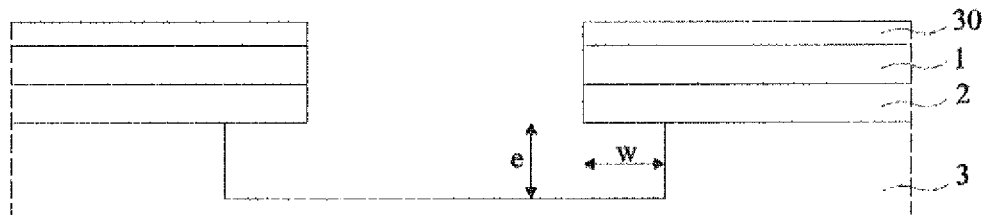

At the step illustrated in FIG. 4D, an isotropic etching of substrate 3 has been performed down to a depth e. The opening extends across a width w substantially equal to e.

Figure 4E:
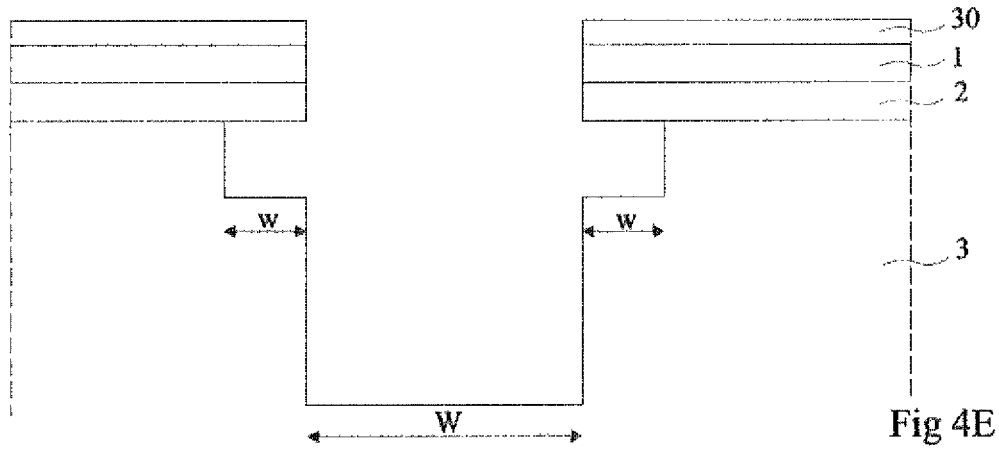

At the step illustrated in FIG. 4E, a new anisotropic etching is performed across a width W defined by the dimensions of mask 30, that is, substantially the same width as the initial width of trench 32 described in relation with FIG. 4B. This thus provides, after filling with an insulating material, a wall such as that illustrated in relation with FIG. 3A having on the most part of its height a width W and having on a small part of its height, just under insulating layer 2, lateral extensions having a width w.

The fact that the obtaining of the structure of FIG. 4E implies no masking step other than the initial step of masking of layer 30, which is anyhow necessary to define the trench, should be noted. The other steps implemented in the method are non-critical steps currently used in integrated circuit manufacturing.

Further, in the representation of FIGS. 4A to 4E, protection layer 34 has not been shown in FIG. 4D. It should be noted that protection layer 34 may or not be removed, and that if it is removed, this may be done immediately after the isotropic etching described in relation with FIG. 4D or just before the trench filling after its deepening illustrated in relation with FIG. 4E. According to the moment when this removal is carried out, the trench widths may be slightly modified.

FIGS. 5A to 5D show another way to form a wall such as in FIG. 3A.

Figure 5A:
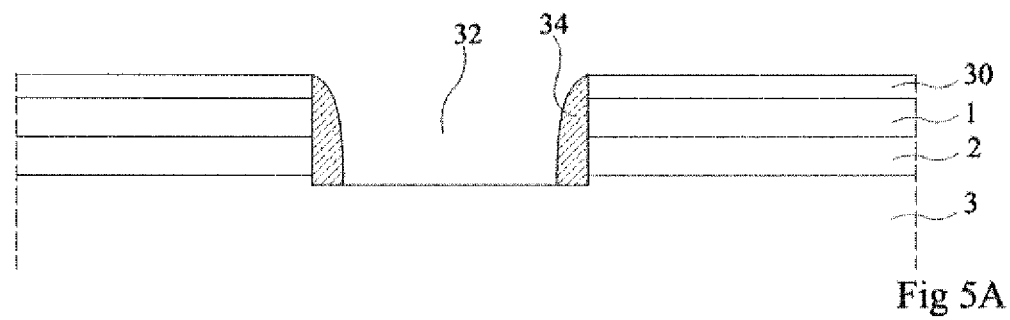
FIGS. 5A to 5D illustrate successive steps of the forming of a wall such as that in FIG. 3A according to a second embodiment.

FIG. 5A is identical to FIG. 4C.

Figure 5B:
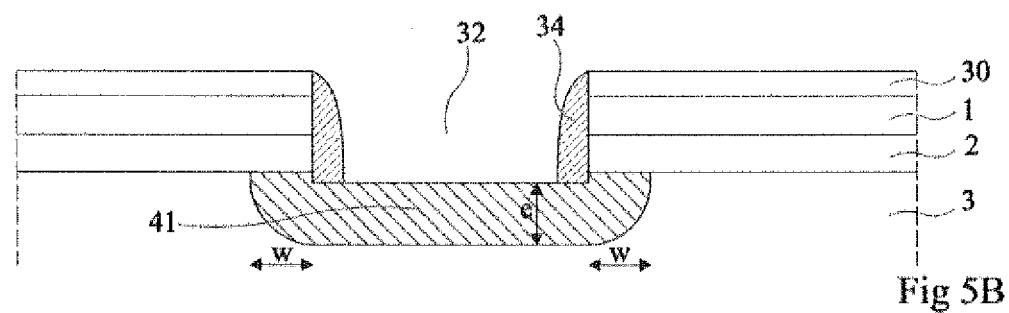

At the step of FIG. 5B, instead of performing, as in the case of FIG. 4D, an isotropic etching of the substrate material, a thermal oxidation is carried out to oxidize an area 41 down to a depth e, area 41 extending under the remaining portion of insulating layer 2 across a width w.

Figure 5C:
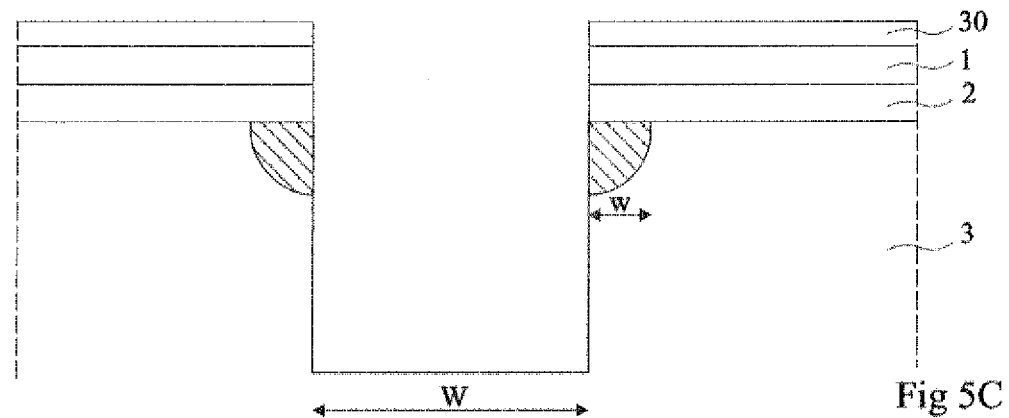

At the step of FIG. 5C, as previously at the step of FIG. 4E, the trench, which then has a width W substantially equal to the width of the opening initially formed in masking layer 30, is deepened.

Figure 5D:
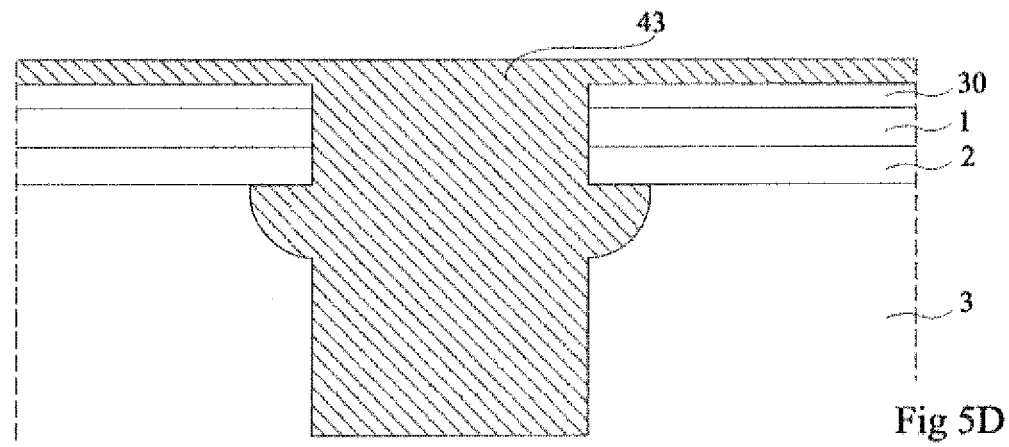

At the step illustrated in FIG. 5D, the trench is filled with an insulating material, currently silicon oxide 43. Next steps, not shown, for obtaining the wall of FIG. 3A will for example comprise removing masking layer 30 and the upper portion of oxide layer 43 by chem.-mech. polishing.

As previously, spacer structure 34 is no longer shown in FIG. 5C. It should be understood that the spacer may be removed before or after the deepening of the trench illustrated in FIG. 5C, or else that this spacer may be left in place. It should be understood that the widths are not exactly the same according to whether spacer structure 34 has or not been left in place but the results are quite equivalent, the important point being the existence of lateral extensions of the trench across a width w.

Specific embodiments of the present invention have been described. Various alterations, modifications, and improvements will occur to those skilled in the art. In particular, although an SOI-type structure has been previously described as comprising a silicon layer on a thin silicon oxide layer, itself formed on a silicon substrate, other materials may be used. In particular, the thin insulating layer may be an insulating material other than silicon oxide, for example, sapphire or diamond, and semiconductor layer 1 may be made of a semiconductor material other than silicon, for example, germanium or silicon-germanium.

Further, although the insulating material filling the previously-described trench has always been indicated as being silicon oxide, it will be understood by those skilled in the art that any adapted insulating material may be used.

Although this has not been described in relation with all the above embodiments, if the integrated circuits comprise biasing wells under at least some of the active areas, the insulation walls will penetrate into the substrate beyond the bottom of these wells.

The structure according to the present invention is particularly well adapted to integrated circuit manufacturing technologies where the active areas have a width ranging from 60 to 100 nm, the biasing wells formed under the active components have a depth approximately ranging from 100 to 150 nm, the trenches have a depth on the order of 250 nm and a width approximately ranging from 50 to 100 nm, the lateral extensions under the oxide layer approximately reaching a length between 20 and 50 nm, insulating layer 2 having a thickness approximately ranging from 10 to 25 nm, and semiconductor layer 1 having a thickness approximately ranging from 10 to 25 nm.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for manufacturing an insulating wall separating transistors formed in a thin semiconductor layer carried by an insulating layer, the insulating layer carried by a semiconductor substrate, the method comprising:
    etching a trench based upon a pattern of the insulating wall, the trench being etched to have a first width through the thin semiconductor layer, insulating layer, and the semiconductor substrate and extend to the substrate;
    forming a protection layer along sides of the trench;
    removing part of the semiconductor substrate at a bottom of the trench to extend a first depth through and a second width greater than the first width across the semiconductor substrate;
    further etching the trench to extend a second depth greater than the first depth through and the first width across the semiconductor substrate; and
    filling the trench with an insulator.

2. The wall manufacturing method of claim 1, wherein the protection layer is formed after etching and comprises:
    conformally depositing an insulator; and
    removing a portion of the insulator adjacent the bottom of the trench.

3. The wall manufacturing method of claim 2, wherein the insulator comprises silicon nitride.

4. The wall manufacturing method of claim 1, wherein removing part of the semiconductor substrate comprises removing part of the semiconductor substrate by isotropic etching.

5. The wall manufacturing method of claim 1, wherein removing part of the semiconductor substrate comprises removing part of the semiconductor substrate by oxidization 6. A method for manufacturing an insulating wall separating transistors formed in a semiconductor layer carried by an insulating layer, the insulating layer carried by a semiconductor substrate, the method comprising:
    etching a trench based upon a pattern of the insulating wall, the trench being etched to have a first width through the thin semiconductor layer, insulating layer, and the semiconductor substrate and extend to the substrate;
    removing part of the semiconductor substrate at a bottom of the trench to extend a first depth through and a second width greater than the first width across the semiconductor substrate; and
    further etching the trench to extend a second depth greater than the first depth through and the first width across the semiconductor substrate.

7. The method claim 6, further comprising forming a protection layer along sides of the trench.

8. the method of claim 6, further comprising filling the trench with an insulator.

9. The method of claim 6, further comprising, after etching:
    conformally depositing an insulator; and
    removing a portion of the insulator adjacent the bottom of the trench.

* * * * *